(12) United States Patent
Lee et al.

(10) Patent No.: US 9,899,395 B1
(45) Date of Patent: Feb. 20, 2018

(54) SEMICONDUCTOR DEVICE AND METHOD FOR MANUFACTURING THE SAME

(71) Applicant: TAIWAN SEMICONDUCTOR MANUFACTURING CO., LTD., Hsinchu (TW)

(72) Inventors: Chih-Ming Lee, Tainan (TW); Po-Wei Liu, Tainan (TW); Chiang-Ming Chuang, Chunghua County (TW); Yung-Lung Hsu, Tainan (TW); Hsin-Chi Chen, Tainan (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/219,497

(22) Filed: Jul. 26, 2016

(51) Int. Cl.
| | |
|---|---|
| *H01L 29/423* | (2006.01) |
| *H01L 27/11521* | (2017.01) |
| *H01L 23/528* | (2006.01) |
| *H01L 23/532* | (2006.01) |
| *H01L 21/768* | (2006.01) |
| *H01L 21/311* | (2006.01) |
| *H01L 21/285* | (2006.01) |

(52) U.S. Cl.
CPC ... *H01L 27/11521* (2013.01); *H01L 21/31111* (2013.01); *H01L 21/76816* (2013.01); *H01L 21/76877* (2013.01); *H01L 23/528* (2013.01); *H01L 23/53209* (2013.01); *H01L 23/53271* (2013.01); *H01L 29/42328* (2013.01); *H01L 29/42368* (2013.01); *H01L 21/2855* (2013.01); *H01L 21/28556* (2013.01); *H01L 2924/1438* (2013.01)

(58) Field of Classification Search
CPC ......... H01L 29/42344; H01L 29/42328; H01L 2924/1438; H01L 2924/1451; H01L 2924/14511; H01L 27/112; H01L 27/11521; H01L 21/76877; H01L 23/53271; H01L 23/53206; H01L 29/42368; H01L 29/7883
See application file for complete search history.

(56) References Cited

U.S. PATENT DOCUMENTS

| | | | | |
|---|---|---|---|---|
| 5,053,841 A | * | 10/1991 | Miyakawa | H01L 29/7886 257/318 |
| 6,901,006 B1 | * | 5/2005 | Kobayashi | G11C 16/0416 257/314 |
| 7,598,561 B2 | * | 10/2009 | Chen | H01L 27/115 257/314 |
| 9,502,582 B2 | * | 11/2016 | Fan | H01L 29/66825 |
| 2008/0203463 A1 | * | 8/2008 | Van Schaijk | H01L 29/7883 257/320 |
| 2016/0013195 A1 | * | 1/2016 | Tsao | H01L 29/42328 257/316 |

* cited by examiner

*Primary Examiner* — Galina Yushina
(74) *Attorney, Agent, or Firm* — McClure, Qualey & Rodack, LLP

(57) ABSTRACT

A semiconductor device includes a pair of erase gate lines, a pair of control gate lines and a pair of word lines. The pair of control gate lines are disposed on the erase gate lines. Each one of the control gate lines includes a plurality of segments between which portions of one of the pair of erase gate lines are seen in a plan view. In a plan view of the semiconductor device, the pair of word lines are disposed between the control gate lines and extending along edges of the control gate lines.

20 Claims, 5 Drawing Sheets

SEMICONDUCTOR DEVICE AND METHOD FOR MANUFACTURING THE SAME

BACKGROUND

Wide varieties of semiconductor memory devices have been developed and continuously employed in new and expanded uses. The newly developed uses require increased capabilities of integrated circuits but decreased cost in manufacturing. Many semiconductor devices are comprised of multiple types of circuits such as memory and logic circuits. Flash memory has become increasingly popular in recent years. Flash memory cells are typically formed, along with other circuits (non-memory circuits) such as core circuits, as embedded flash memory.

A typical flash memory includes a memory array having a large number of memory cells arranged in blocks. Each of the flash memory cells is fabricated as a field-effect transistor having a control-gate and a floating-gate. The floating-gate is capable of holding charges and is separated from source and drain regions contained in a substrate by a layer of thin oxide. The memory cells may be capable of several operations including program, read, write, and erase. For example, memory cells may be electrically charged by injecting electrons from the drain region through the oxide layer onto the floating-gate. The charges may be removed from the floating-gate, in one known approach, by tunneling the electrons to the source through the oxide layer during an erase operation. The data in a memory cell is thus determined by the presence or absence of a charge on the floating-gate.

While the sizes of semiconductor memory devices become smaller, elements of the layout, for example, bit lines, word lines, control gate lines and erase gate lines are formed finer and closer. However, the closer distance between the elements can induce some defects and affect the efficiency of semiconductor memory devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1-3A are plan views at various stages of fabricating a semiconductor device, in accordance with some embodiments.

DETAILED DESCRIPTION

Figure 1:
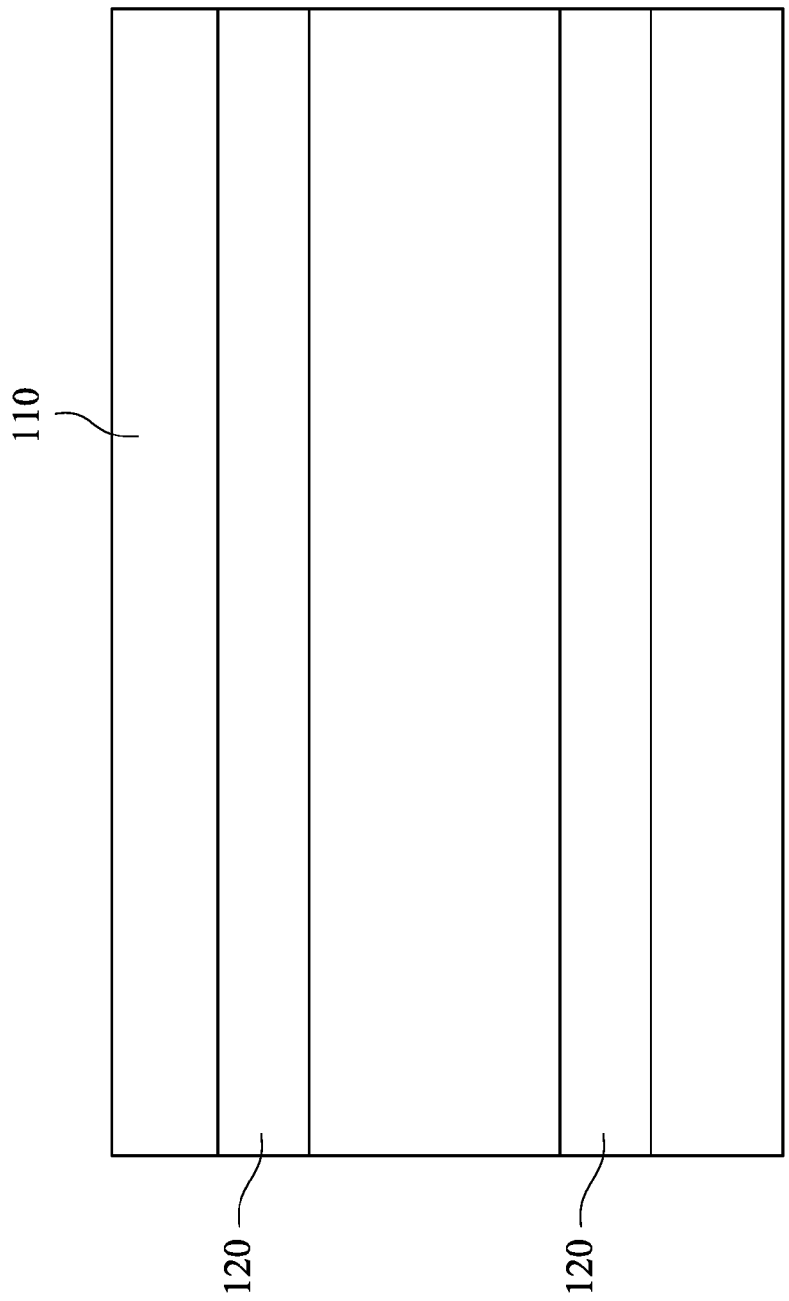

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIGS. 1-3A are plan views at various stages of fabricating a semiconductor device, in accordance with some embodiments. In FIG. 1, a substrate 110 is provided. In some embodiments of the present disclosure, the substrate 110 includes, but not limited to, an elementary semiconductor, a compound semiconductor, an alloy semiconductor, or any other suitable material or combinations thereof. In some embodiments, the elementary includes silicon or germanium in crystal, polycrystalline or an amorphous structure; the compound semiconductor includes silicon carbide, gallium arsenide, gallium phosphide, indium phosphide, indium arsenide, indium antimonide or a combination thereof; the alloy semiconductor includes SiGe, GaAsP, AlInAs, AlGaAs, GaInAs, GaInP, GaInAsP or a combination thereof.

A plurality of memory cells (not shown) are arranged in an array on the substrate 110. The array includes memory cells arranged in rows and columns. A few of the plurality of memory cells making up the array by intersections of bit line (BL) columns, and word line (WL) rows. Bit lines are conducting lines, which may consist of metal, layers of metal, polysilicon or the like. In one aspect of an embodiment, bit lines are made of metal, which may be Al, Cu, other metals and alloys, polysilicon and other conductive materials. The array further includes erase gate rows and control gate rows. A pair of erase gate lines 120 is disposed on the substrate 110, forming erase gate rows in the array. In some embodiments of the present disclosure, the array includes a plurality of pairs of erase gate lines 120 disposed on the substrate 110, forming erase gate rows in the array. The erase gate lines 120 mutually parallel to each other.

Figure 2:
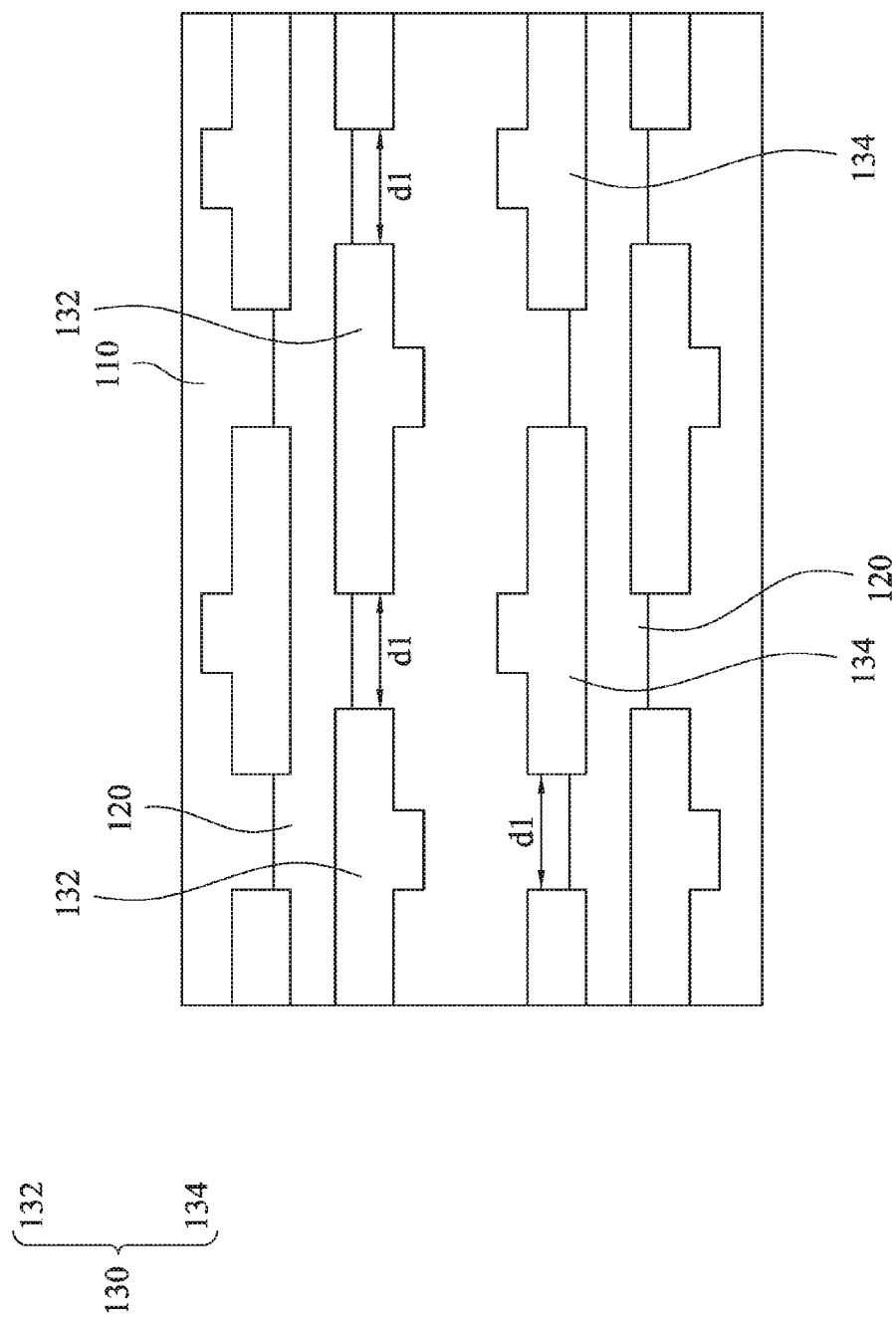

In FIG. 2, a pair of control gate lines 130 is disposed on the erase gate lines 120 and forming control gate rows in the array. In some embodiments of the present disclosure, the array includes a plurality of pairs of control gate lines 130. In some embodiments, the control gate lines 130 are disposed on the edges of the erase gate lines 120. In some embodiments, the control gate lines 130 are segmented, thus there is a spacing between any two adjacent segments of a control gate line. A width d1 of a spacing is about 0.4-0.8 μm, such as 0.5 μm, 0.6 μm or 0.7 μm. In some embodiments, the widths d1 of spacings of a control gate line 130 are the same. In some embodiments, some of the widths d1 of spacings of a control gate line 130 can be different from the other widths of spacings in accordance with needs of a layout design. In some embodiments of the present disclosure, there are a plurality of protrusions of the control gate lines 130. In some embodiments, each segment of the control gate lines 130 has at least a protrusion. In some embodiments, the shape of the protrusions can be a square, a semicircle or any other suitable shapes. The protrusions of the control gate lines 130 are formed for the landing of control gate contacts. That is, control gate lines 130 with protrusions can make the landing of the control gate contacts easier to avoid disconnections of a circuit.

The pair of control gate lines includes a first segmented control gate line 132 and a second segmented control gate line 134. There is a spacing between any two adjacent segments of the first control gate line 132 and there is a spacing between any two adjacent segments of the second control gate line 134. There are a plurality of protrusions of the control gate lines 130. The protrusions of one of the control gate lines 130 extend into a direction of the spacing of the other control gate line 130. In some embodiments of the present disclosure, the protrusions of the first control gate line 132 extend into a direction of the spacing of the second control gate line 134. The protrusions of the second control gate line 134 extend into a direction of the spacing of the first control gate line 132. In some embodiments, the protrusions of the pair of the control gate lines 130 face toward the other control gate line 130. In some embodiments, the protrusions of the pair of the first control gate line 132 face toward the second control gate line 134. In some embodiments, the protrusions of the pair of the second control gate line 134 face toward the first control gate line 132.

If there is no spacing on the opposing side of a protrusion of the control gate line 130, the trench at the protrusion will have a high aspect ratio. To be specific, a cross-section of the trench at a protrusion has a high aspect ratio while a cross-section of the trench without a protrusion has a low aspect ratio. When depositing a layer on a trench with a high aspect ratio, the layer may not be conformally deposited in the trench because the trench is too narrow so that the depositing layer is filled out to form a thicker layer. A thicker depositing layer may induce defects such as residues after an etching process. Thus a spacing on the opposing side of a protrusion of the control gate lines 130 can decrease the aspect ratio of the trench at the protrusion of the control gate lines 130.

In some embodiments of the present disclosure, the width d1 of the spacing of the control gate lines 130 is about 0.8-2.5 times a width of the protrusion of the control gate line 130, such as 1.2 times, 1.7 times or 2.2 times. For example, if a width of a protrusion of the control gate line is 2.5 μm, the width d1 of the spacing corresponding to the protrusion is about 2-6.25 μm, such as 5 μm. In some embodiments, the spacings and protrusions of a control gate line 130 are alternately arranged. In some embodiments, the spacings and protrusions of a control gate line 130 are not alternately arranged. This is dependent on the needs of a layout design.

Figure 3A:
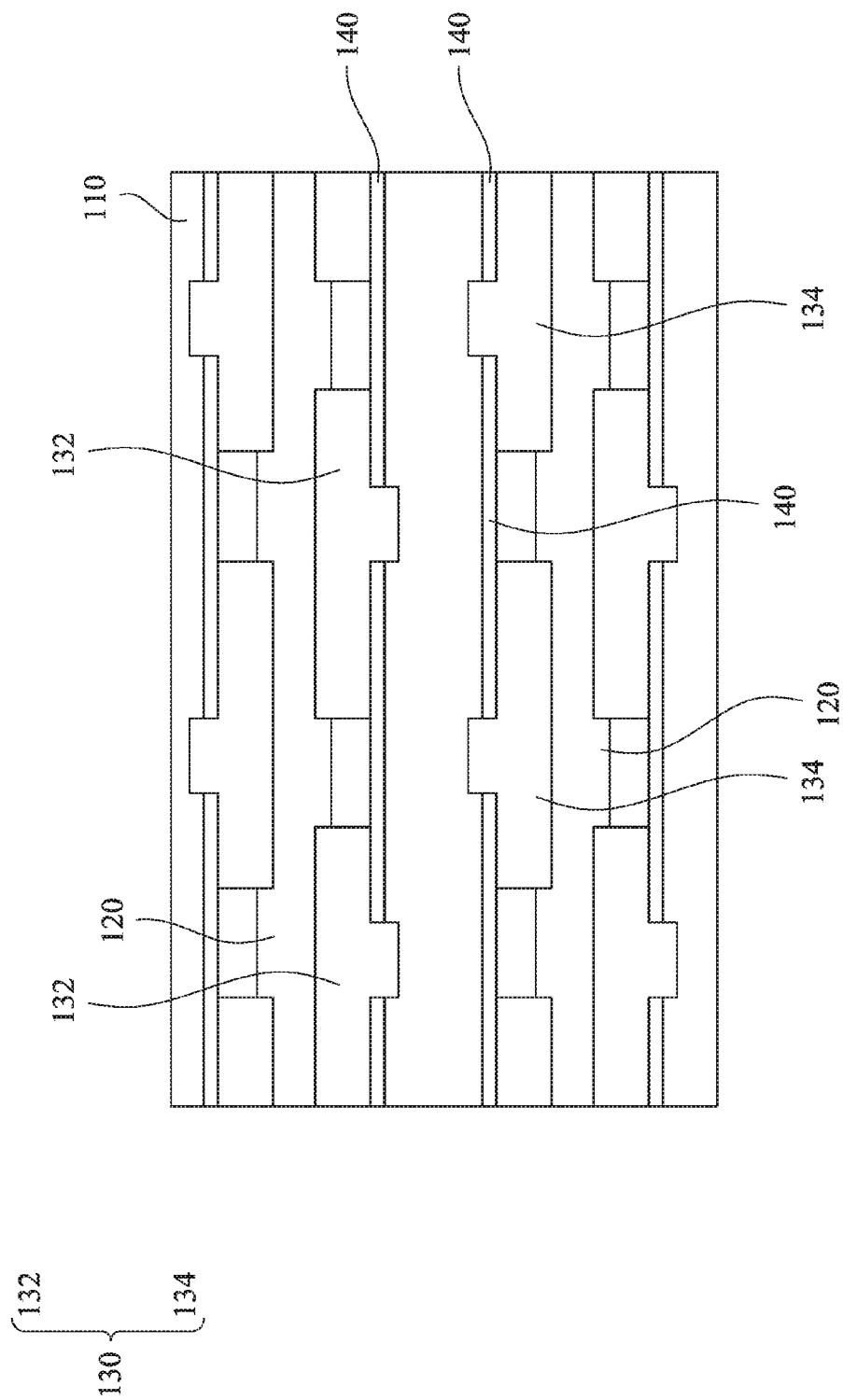

In FIG. 3A, a pair of word lines 140 is disposed between the pair of control gate lines 130 in the top view and extends along the edges of the control gate lines 130 to form word line rows in the array. In some embodiments of the present disclosure, the array includes a plurality of pairs of word lines 140. Word lines are typically polysilicon lines but may include other conductive materials. In some embodiments, the array includes a plurality of bit lines (not shown) forming columns in the array. A distance from a word line to an adjacent erase gate line is controlled to prevent short circuit. To be specific, a word line cannot directly contact a erase gate line. In some embodiments of the present disclosure, a distance from a word line to an adjacent erase gate line is larger than 0.03 μm.

Figure 3B:
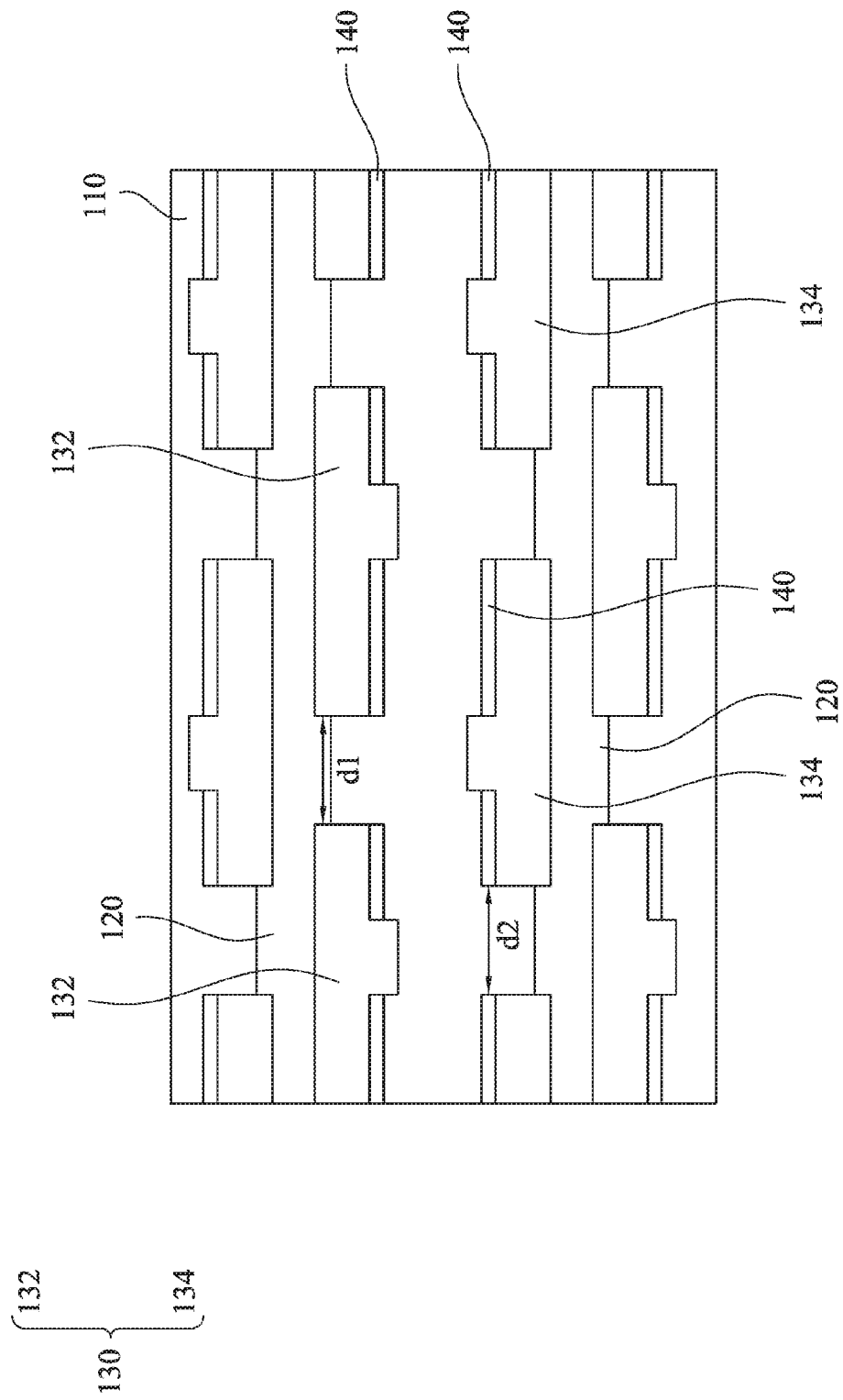
FIG. 3B is a plan view of a semiconductor device having segmented control gate lines with protrusions, in accordance with some embodiments.

FIG. 3B is a plan view of a semiconductor device having segmented control gate lines with protrusions, in accordance with some embodiments. A substrate 110 is provided. In some embodiments of the present disclosure, the substrate 110 includes, but not limited to, an elementary semiconductor, a compound semiconductor, an alloy semiconductor, or any other suitable material or combinations thereof. In some embodiments, the elementary includes silicon or germanium in crystal, polycrystalline or an amorphous structure; the compound semiconductor includes silicon carbide, gallium arsenide, gallium phosphide, indium phosphide, indium arsenide, indium antimonide or a combination thereof; the alloy semiconductor includes SiGe, GaAsP, AlInAs, AlGaAs, GaInAs, GaInP, GaInAsP or a combination thereof. A plurality of memory cells (not shown) are arranged in an array on the substrate 110. The array includes memory cells arranged in rows and columns. A few of the plurality of memory cells making up the array by intersections of bit line (BL) columns, and word line (WL) rows. A pair of erase gate lines 120 is disposed on the substrate 110, forming erase gate rows in the array. In some embodiments of the present disclosure, the array includes a plurality of pairs of erase gate lines 120 disposed on the substrate 110, forming erase gate rows in the array. The erase gate lines 120 mutually parallel to each other.

A pair of control gate lines 130 is disposed on the erase gate lines 120 and forming control gate rows in the array. In some embodiments of the present disclosure, the array includes a plurality of pairs of control gate lines 130. In some embodiments, the control gate lines 130 are disposed on the edges of the erase gate lines 120. In some embodiments of the present disclosure, the control gate lines 130 are segmented, thus there is a spacing between any two adjacent segments of a control gate line. A width d1 of a spacing is about 0.4-0.8 μm, such as 0.5 μm, 0.6 μm or 0.7 μm. In some embodiments of the present disclosure, the widths d1 of spacings of a control gate line are the same. In some embodiments, there are a plurality of protrusions of the control gate lines 130. In some embodiments, each segment of the control gate lines has at least a protrusion. In some embodiments, the spacings and protrusions of the control gate lines 130 are alternately arranged. In some embodiments, the spacings and protrusions of a control gate line 130 are not alternately arranged.

The pair of control gate lines includes a first segmented control gate line 132 and a second segmented control gate line 134. There is a spacing between any two adjacent segments of the first control gate line 132 and there is a spacing between any two adjacent segments of the second control gate line 134. There are a plurality of protrusions of the control gate lines 130. The protrusions of one of the control gate lines 130 extend out from opposing sides of the spacing of the other control gate line 130. In some embodiments, the protrusions of the pair of the control gate lines 130 face toward the other control gate line 130.

In some embodiments of the present disclosure, the width d1 of the spacing of the control gate lines 130 is about 0.8-2.5 times a width of the protrusion of the control gate line 130, such as 1.2 times, 1.7 times or 2.2 times.

A pair of word lines 140 is disposed between the pair of control gate lines 130 and extends along the edges of the control gate lines 130 to form word line rows in the array. In some embodiments of the present disclosure, the array includes a plurality of pairs of word lines 140. Word lines are typically polysilicon lines but may include other conductive materials. In some embodiments of the present disclosure, the array includes a plurality of bit lines (not shown) forming columns in the array. The word lines 140 include a plurality of segments corresponding to the control gate lines 130 and a spacing between any two adjacent segments of one of the word lines 140. The width d2 of the spacing of the word lines 140 is about 0.8-1.2 times a width d1 of the spacing of the control gate line 130. To prevent short circuit, the word lines won't directly contact the erase gate lines 120. Thus, the word lines are disposed between the pair of control gate lines 130 and have segments corresponding to the control lines.

Figure 3C:
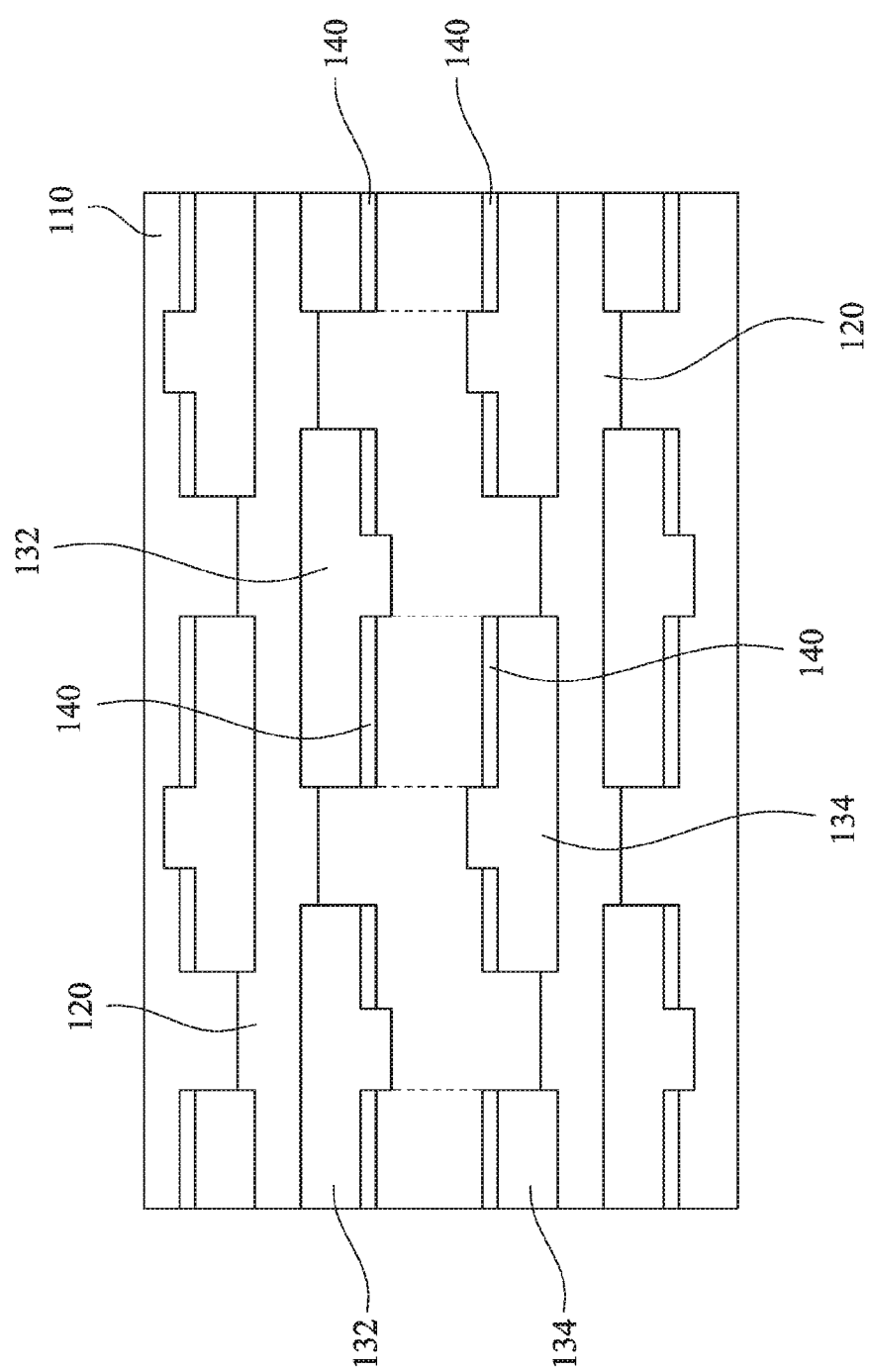
FIG. 3C is a plan view of a semiconductor device having segmented control gate lines with protrusions, in accordance with some embodiments.

FIG. 3C is a plan view of a semiconductor device having segmented control gate lines with protrusions, in accordance with some embodiments. The difference from FIG. 3C to FIG. 3B is the position of the spacings of a pair of the control gate lines 130. The control gate lines 130 include a first control gate line 132 and a second control gate line 134. A spacing is between any two adjacent segments of the first control gate line 132 or between any two adjacent segments of the second control gate line 134. An edge of a protrusion of a control gate line aligns with an edge of opposing sides of the spacing of the other control gate line. In some embodiments, each protrusion of the first control gate line 132 aligns with an edge of opposing sides of the spacing of the second control gate line 134. Each protrusion of the second control gate line 134 aligns with an edge of opposing sides of the spacing of the first control gate line 132. In some embodiments, the relative positions of the spacings and protrusions in FIG. 3B is about center to center. To be specific, a center of a protrusion of a control gate line aligns with a center of opposing sides of the spacing of the other control gate line.

Embodiments of the method for manufacturing the semiconductor device are described below in detail.

As shown in FIG. 1, a substrate is provided. A plurality of memory cells (not shown) are formed on the substrate and arranged in an array. A plurality of bit lines (not shown) are formed as columns in the array. A pair of erase gate lines 120 is formed and arranged in rows in the array. In some embodiments of the present disclosure, the array includes a plurality of pairs of erase gate lines 120. The erase gate lines 120 mutually parallel to each other.

As shown in FIG. 2, a pair of control gate lines 130 is formed on the edges of the erase gate lines 120 to form control gate rows in the array. In some embodiments of the present disclosure, the array includes a plurality of pairs of control gate lines 130. The control gate lines 130 are disposed on the edges of the erase gate lines 120. In some embodiments, the control gate lines 130 are segmented, thus there is a spacing between any two adjacent segments of a control gate line. A width d1 of a spacing is about 0.4-0.8 µm, such as 0.5 µm, 0.6 µm or 0.7 µm. In some embodiments of the present disclosure, there are a plurality of protrusions of the control gate lines 130. In some embodiments, the control gate lines are formed by photolithography and etching to obtain a desired pattern. In some embodiments, each segment of the control gate lines has at least a protrusion. In some embodiments of the present disclosure, the spacings and protrusions of the control gate lines 130 are alternately arranged.

The pair of control gate lines includes a first segmented control gate line 132 and a second segmented control gate line 134. There is a spacing between any two adjacent segments of the first control gate line 132 and there is a spacing between any two adjacent segments of the second control gate line 134. There are a plurality of protrusions of the control gate lines 130. The protrusions of one of the control gate lines 130 extend out from opposing sides of the spacing of the other control gate line 130. In some embodiments of the present disclosure, the protrusions of the pair of the control gate lines 130 face toward the other control gate line 130.

After forming the control gate lines 130, a layer of word line 140 material is formed to cover the layout including the substrate 110, the bit lines, the erase gate lines 120 and the control gate lines 130. The material of word line 140 can be polysilicon and may include other conductive materials. In some embodiments of the present disclosure, the layer of word line 140 material is formed by a chemical vapor deposition (CVD) process, a physical vapor deposition (PVD) process, an atomic layer deposition (ALD) process, spin-on coating, another suitable formation process or a combination thereof.

Then a self-aligned etching process is performed to obtain patterned word lines. The self-aligned etching process allows removal of parallel strips of layer especially for matrix-type topography of memory devices. In some embodiments of the present disclosure, the self-aligned etching process uses an etchant including carbon fluorides ($C_xF_y$), sulfur hexafluoride ($SF_6$), oxygen gas ($O_2$), helium (He), carbon chlorides ($C_xCl_y$), argon (Ar), another suitable etchant material or a combination thereof.

As shown in FIG. 3A, after the self-aligned etching process, a pair of word lines 140 is formed between the pair of control gate lines 130 and extends along the edges of the control gate lines 130 to form word line rows in the array. In some embodiments of the present disclosure, the array includes a plurality of pairs of word lines 140. In some embodiments, after forming the word lines, an additional photolithography can be performed to make segmented word lines as shown in FIG. 3B or 3C. In some embodiments of the present disclosure, the desired areas of word lines 140 are removed to form spacings of the word lines 140, and the word lines 140 then become segmented. The desired areas correspond to the spacings of the control gate lines 130. The segmented word lines 140 include a plurality of segments corresponding to the control gate lines 130 and a spacing between any two adjacent segments of one of the word lines 140. The width d2 of the spacing of the word lines 140 is about 0.8-1.2 times a width d1 of the spacing of the control gate lines 130.

According to some embodiments of the present disclosure, a semiconductor device having segmented control gate lines 130 with protrusions is provided. The protrusions of the control gate lines 130 are provided for control gate contact landing. The segmented control gate lines 130 with a spacing between any two adjacent segments of one of the control gate lines 130 can reduce defects such as residue. Also, the layout size of the semiconductor device can keep the same size without increasing the distance between control gate lines. In some embodiments, the word lines 140 extend along the edges of the control gate lines 130 to form word line rows in the array. In some embodiments of the present disclosure, the word lines 140 are segmented and include a plurality of segments corresponding to the control gate lines 130. The segmented word lines can further prevent short circuit.

According to some embodiments of the present disclosure, a semiconductor device includes a pair of erase gate lines, a pair of control gate lines, a pair of word lines and a plurality of bit lines. The memory cells are arranged in an array. The erase gate lines form erase gate rows in the array.

The control gate lines are disposed on the erase gate lines and form control gate rows in the array, including a first segmented control gate line, a second segmented control gate line, a spacing between any two adjacent segments of the first control gate line and between any two adjacent segments of the second control gate line, and a plurality of protrusions of the control gate lines, wherein the protrusions of one of the control gate lines extend out from opposing sides of the spacing of the other control gate line. The word lines are disposed between the control gate lines and extending along the edges of the control gate lines to form word line rows in the array, wherein the word lines include a plurality of segments corresponding to the control gate lines and a spacing between any two adjacent segments of one of the word lines. Each bit line forms a column in the array.

According to some embodiments of the present disclosure, a semiconductor device includes a pair of erase gate lines, a pair of control gate lines, a pair of word lines and a plurality of bit lines. The memory cells are arranged in an array. The erase gate lines form erase gate rows in the array. The control gate lines are disposed on the erase gate lines and form control gate rows in the array, including a first segmented control gate line, a second segmented control gate line, a spacing between any two adjacent segments of the first control gate line and between any two adjacent segments of the second control gate line, and a plurality of protrusions of the control gate lines, wherein the protrusions of one of the control gate lines extend out from opposing sides of the spacing of the other control gate line. The word lines are disposed between the control gate lines and extending along the edges of the control gate lines to form word line rows in the array. Each bit line forms a column in the array.

According to some embodiments of the present disclosure, a method for manufacturing a semiconductor device includes: forming a plurality of memory cells arranged in an array; forming a plurality of bit lines arranged in columns in the array; forming a pair of erase gate lines arranged in rows in the array; forming a pair of control gate lines disposed on the erase gate lines arranged in rows in the array, wherein the control gate lines includes a plurality of segments and protrusions, the protrusions of one of the control gate lines extend out from opposing sides of spacings of the other control gate line; and forming a pair of word lines disposed between the control gate lines and extending along the edges of the control gate lines to form word line rows in the array.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device comprising:
   a pair of erase gate lines forming erase gate rows in an array;
   a pair of control gate lines disposed on the erase gate lines and forming control gate rows in the array, comprising:
   a segmented first control gate line and a segmented second control gate line;
   a spacing between any two adjacent segments of the segmented first control gate line or between any two adjacent segments of the segmented second control gate line; and
   a plurality of protrusions of the control gate lines in a plan view, wherein each protrusion of one control gate line, is disposed, at least partially, opposite to a corresponding spacing of the other control gate line; and
   in a plan view of the semiconductor device, a pair of word lines disposed between the control gate lines and extending along edges of the control gate lines to form word line rows in the array, wherein each of the word lines comprises a plurality of word line segments and spacing corresponding to an adjacent control gate line.

2. The semiconductor device of claim 1, wherein the word lines are made from polysilicon or from another conductive materials.

3. The semiconductor device of claim 1, wherein the spacing of the word line is about 0.8-1.2 times a width of the spacing of any one of the segmented control gate lines.

4. The semiconductor device of claim 1, wherein the spacing of any one of the segmented control gate lines is about 0.8-2.5 times a width of a protrusion of any of the control gate lines.

5. The semiconductor device of claim 1, wherein a protrusion of any of the control gate lines face toward the other control gate line.

6. The semiconductor device of claim 1, wherein the spacing and protrusions of the control gate lines are alternately arranged.

7. The semiconductor device of claim 1, wherein as seen in a plan view, an edge of the protrusions of the segmented first control gate line aligns with an edge of a segment in the segmented second control gate line.

8. A semiconductor device comprising:
   a pair of erase gate lines forming erase gate rows in the array;
   a pair of control gate lines disposed on the erase gate lines and forming control gate rows in the array, comprising:
   a segmented first control gate line and a segmented second control gate line;
   a spacing between any two adjacent segments of the segmented first control gate line or between any two adjacent segments of the segmented second control gate line; and
   a plurality of protrusions of the control gate lines in a plan view, wherein each protrusion of the control gate line is disposed, at least partially, opposite to a corresponding spacing of the other control gate line; and
   in a plan view of the semiconductor device, a pair of word lines disposed between the control gate lines and extending along edges of the control gate lines to form word line rows in the array.

9. The semiconductor device of claim 8, wherein the word lines are made of polysilicon or from another conductive materials.

10. The semiconductor device of claim 8, wherein the spacing of any one of the segmented control gate lines is about 0.8-2.5 times a width of the protrusion of the control gate line.

11. The semiconductor device of claim 8, wherein a protrusion of any of the control gate lines faces toward the other control gate line.

12. The semiconductor device of claim 8, wherein the spacings and a protrusion of any of the control gate lines are alternately arranged.

13. The semiconductor device of claim 8, wherein as seen in a plan view, an edge of the protrusions of the segmented first control gate line aligns with an edge of a segment in the segmented second control gate line.

14. The semiconductor device of claim 10, wherein the spacing is about 0.4-0.8 μm.

15. A semiconductor device comprising:
a pair of erase gate lines in an array;
a pair of control gate lines disposed in the array and on the erase gate lines, wherein each one of the control gate lines comprises a plurality of segments between which portions of one of the pair of erase gate lines are seen in a plan view; and
in a plan view of the semiconductor device, a pair of word lines disposed in the array and between the control gate lines and extending along edges of the control gate lines.

16. The semiconductor device of claim 15, wherein the word lines are made from polysilicon or from another conductive material.

17. The semiconductor device of claim 15, wherein the pair of control gate lines comprise a first control gate line and a second control gate line, a plurality of protrusions of the first control gate line, as seen in a plan view of the semiconductor device, face toward the second control gate line.

18. The semiconductor device of claim 15, wherein the control gate lines comprise a first control gate line and a second control gate line, a plurality of protrusions of the first control gate line seen in a plan view, wherein each of the plurality of protrusions is disposed opposite to a corresponding spacing between any two adjacent segments of the second control gate line.

19. The semiconductor device of claim 15, wherein the control gate lines comprise a first control gate line and a second control gate line, an edge of a protrusion of the first control gate line aligns with an edge of the segments of the second control gate lines as seen in a plan view.

20. The semiconductor device of claim 18, wherein the spacing is about 0.4-0.8 μm.

* * * * *